United States Patent
Chen et al.

(10) Patent No.: US 11,417,412 B1
(45) Date of Patent: Aug. 16, 2022

(54) CELL TRACE CIRCUIT FOR MEASURING I-V PROPERTY OF MEMORY CELL

(71) Applicant: United Microelectronics Corp., Hsinchu (TW)

(72) Inventors: Chung-Hao Chen, Taoyuan (TW); Hsiao-Hua Lu, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/189,094

(22) Filed: Mar. 1, 2021

(51) Int. Cl.
*G11C 29/00* (2006.01)
*G11C 29/50* (2006.01)
*G11C 13/00* (2006.01)

(52) U.S. Cl.
CPC .... *G11C 29/50004* (2013.01); *G11C 13/0007* (2013.01); *G11C 2029/5004* (2013.01)

(58) Field of Classification Search
CPC .......... G11C 29/50004; G11C 13/0007; G11C 2029/5004
See application file for complete search history.

(56) References Cited

U.S. PATENT DOCUMENTS

| | | | |
|---|---|---|---|
| 8,930,174 B2 | 1/2015 | Lu | |
| 2013/0148405 A1* | 6/2013 | Kang | G11C 29/08 365/158 |
| 2014/0241042 A1* | 8/2014 | Park | G11C 13/0007 365/148 |
| 2015/0364187 A1* | 12/2015 | Kim | G11C 11/1675 365/148 |
| 2019/0080754 A1* | 3/2019 | Tran | G11C 13/004 |

OTHER PUBLICATIONS

Isha Gupta, et al., "Volatility Characterization for RRAM Devices", IEEE Electron Device Letters (vol. 38, Issue: 1), Nov. 22, 2016, pp. 28-31.

* cited by examiner

*Primary Examiner* — Christine T. Tu
(74) *Attorney, Agent, or Firm* — J.C. Patents (57) ABSTRACT

A cell trace circuit includes a memory cell, a voltage generator and a measuring circuit. The memory cell has a resistor and a memory layer coupled in series to have a top electrode, a middle electrode and a bottom electrode, wherein the resistor and the memory layer are coupled at the middle electrode. The voltage generator provides a test bias to the memory cell ranging from a negative voltage to a positive voltage in a reset path or ranging from the positive voltage to the negative voltage in a set path. The measuring circuit is to determine a current (I) and a voltage (V) crossing the memory layer by the test bias.

20 Claims, 10 Drawing Sheets

CELL TRACE CIRCUIT FOR MEASURING I-V PROPERTY OF MEMORY CELL

BACKGROUND OF THE INVENTION

Field of the Invention

The invention relates to a memory cell test, and particularly related to a cell trace circuit used for measuring current-voltage (I-V) property of a memory cell.

Description of Related Art

The resistive memory cell, such as the resistive random access memory (ReRAM) cell, is one of various types of memory cell, based on two resistance states to store binary data.

To program ReRAM cell, due to the material property of transition metal oxide (TMO) in the memory cell, it would include a set process to write the ReRAM cell from a high resistance state to a low resistance state and a reset process to write the ReRAM cell from a low resistance state to a high resistance state. As a result, a binary data depending on the resistance state may be stored. During the reset process, a positive bias is applied to the memory cell to drive the oxygen from buffer layer into the TMO layer to fill the oxygen vacancies, causing the high resistance state. During the set process, a negative bias is applied to the memory cell to remove the oxygen from TMO layer into the buffer layer to induce the oxygen vacancies in the TMO layer, causing the low resistance state.

Since the high resistance state and the low resistance state for each cell in the whole cell array is not identical and varying in a little range. To assure the memory cell in proper operation, the cells in the cell array need to be tested to know the I-V curve of the reset process and the set process for each cell. After testing all cells, a low resistance (LR end) and a high resistance start (HR start) are obtained, according to the statistic result from all cells. The proper operation voltage may be set according to the voltages at the LR end and the high resistance start.

The testing process takes a long time and may degrade the performance of the memory cell. How to efficiently measure the I-V curve for each cell during the test stage is at least an issue for consideration in fabrication.

SUMMARY OF THE INVENTION

The invention provides a cell trace circuit to efficiently perform the I-V curve measurement for the cells of a cell array. Further, the operation bias as applied to the memory cell may be determined in a safe range according to I-V curves of the memory cell, then the life-time may be maintained long.

In an embodiment, the invention provides a cell trace circuit including a memory cell, a voltage generator and a measuring circuit. The memory cell has a resistor and a memory layer coupled in series to have a top electrode, a middle electrode and a bottom electrode, wherein the resistor and the memory layer are coupled at the middle electrode. The voltage generator provides a test bias to the memory cell ranging from a negative voltage to a positive voltage in a reset path or ranging from the positive voltage to the negative voltage in a set path. The measuring circuit is to determine a current (I) and a voltage (V) crossing the memory layer by the test bias.

In an embodiment, as to the cell trace circuit, the test bias as provided by the voltage generator includes a plurality of voltage steps.

In an embodiment, as to the cell trace circuit, the measuring circuit measures voltages at the top electrode, the middle electrode and the bottom electrode to determine the voltage and the current.

In an embodiment, as to the cell trace circuit, it further includes a control circuit, which selects the memory cell and provides the test bias by voltage steps in a first cycle and a second cycle.

In an embodiment, as to the cell trace circuit, the control circuit in the first cycle sets the bottom electrode to 0V and applies the test bias to the top electrode to form a first part of an I-V curve at a first quadrant, wherein the control circuit in the second cycle sets the top electrode to 0V and applies the test bias to the bottom electrode to form a second part of the I-V curve at a third quadrant.

In an embodiment, as to the cell trace circuit, the control circuit determines a low-resistance voltage and a high-resistance voltage for operation on the memory cell according to the I-V curve for each memory cell as tested.

In an embodiment, as to the cell trace circuit, the cell trace circuit is implemented in a memory apparatus under control by a control logic to measure an I-V curve for each memory cell of a cell array, and the control logic determines a low-resistance voltage and a high-resistance voltage for operation on the memory cells of the cell array, according to the I-V curves for all memory cells as tested.

In an embodiment, as to the cell trace circuit, the voltage is a divided voltage of the test bias on the memory layer and the current is a calculated quantity according to a divided voltage on the resistor.

In an embodiment, the invention also provides a method for measuring current-voltage (I-V) property of a resistive memory. The method includes selecting a memory cell from a cell array, wherein the memory cell has a resistor and a memory layer coupled in series to have a top electrode, a middle electrode and a bottom electrode, wherein the resistor and the memory layer are coupled at the middle electrode. In addition, the method includes using a voltage generator to provide a test bias to the memory cell, ranging from a negative voltage to a positive voltage in a reset path or ranging from the positive voltage to the negative voltage in a set path, and using a measuring circuit to determine a current (I) and a voltage (V) crossing the memory layer by the test bias.

In an embodiment, as to the method, the test bias as provided by the voltage generator includes a plurality of voltage steps.

In an embodiment, as to the method, the current and the voltage determined in the measuring circuit form an I-V curve for the reset path and the set path.

In an embodiment, as to the method, the measuring circuit measures voltages at the top electrode, the middle electrode and the bottom electrode to determine the voltage and the current.

In an embodiment, as to the method, the measuring circuit as provided includes an amplifier to amplify output voltages from the memory cell at the top electrode, the middle electrode and the bottom electrode. In addition, an analog to digital converter is includes to receive the output voltages and a data latch is included to output the voltage in digital form.

In an embodiment, as to the method, the method further includes providing a control circuit, wherein the control circuit selects the memory cell and provides the test bias by voltage steps in a first cycle and a second cycle.

In an embodiment, as to the method, the test bias is applied between the top electrode and the bottom electrode but in different direction in the first cycle and the second cycle.

In an embodiment, as to the method, the control circuit as provided also controls the memory cell with a forming bias to form a memory capability before providing the test bias.

In an embodiment, as to the method, the control circuit in the first cycle sets the bottom electrode to 0V and applies the test bias to the top electrode to form a first part of an I-V curve at a first quadrant, wherein the control circuit in the second cycle sets the top electrode to 0V and applies the test bias to the bottom electrode to form a second part of the I-V curve at a third quadrant.

In an embodiment, as to the method, the control circuit determines a low-resistance voltage and a high-resistance voltage for operation on the memory cell according to the I-V curve for each memory cell as tested.

In an embodiment, as to the method, the method is adapted in a memory apparatus under control by a control logic to measure an I-V curve for each memory cell of a cell array, and the control logic determines a low-resistance voltage and a high-resistance voltage for operation on the memory cells of the cell array, according to the I-V curves for all memory cells as tested.

In an embodiment, as to the method, the voltage is a divided voltage of the test bias on the memory layer and the current is a calculated quantity according to a divided voltage on the resistor.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention is directed to a cell trace circuit used for measuring current-voltage (I-V) property of a memory cell. The cell trace circuit allows to efficiently perform the I-V curve measurement on the cells of a cell array. In a further application, the operation bias as applied to the memory cell may be determined in a safe range according to the IV curves of the cells then the life-time may be maintained long.

Multiple embodiments are provided for describing the invention but the invention is not just limited to the embodiments as provided.

The resistive memory cell in an embodiment has variable resistance due to the material property the transition metal oxide (TMO) in the memory cell. The oxygen amount contained in the TMO layer would determine the resistances and the TMO layer. The resistance has a minimum and a maximum in two states, in which a low resistance end (LR END) is the resistance minimum state and a high resistance start (HR START) is the resistance maximum state. The resistance states of the TMO layer may be used to store the binary data.

Figure 1A:
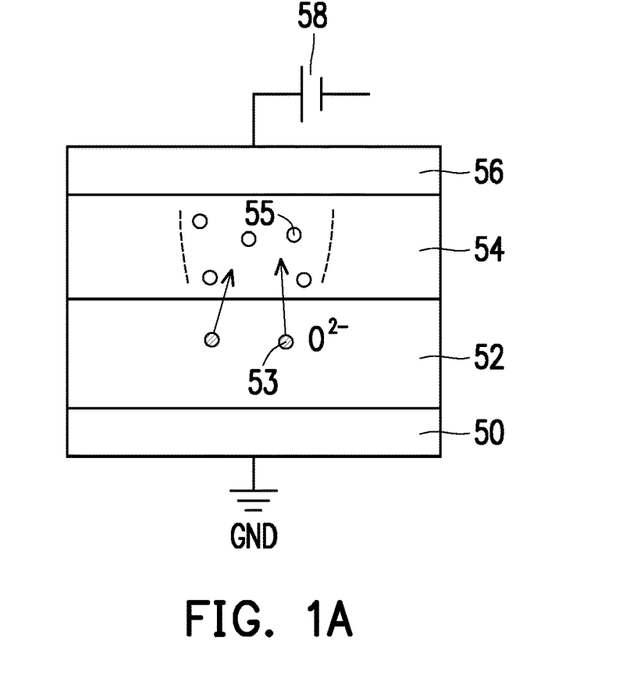
FIG. 1A is a drawing, schematically illustrating a mechanism of a reset process on a ReRAM cell to have a high resistance state, according to an embodiment of the invention.

FIG. 1A is a drawing, schematically illustrating a mechanism of a reset process on a ReRAM cell to have a high resistance state, according to an embodiment of the invention. Referring to FIG. 1, the ReRAM cell usually includes two electrodes 50 and 56. A buffer layer 52 and a TMO layer 54 are sandwiched between the electrode 50 and the electrode 56. In an example, the buffer layer 52 is adjacent to the electrode 50 and the TMO layer is adjacent to the electrode 56. The buffer layer 52 is used to provide or attract oxygen ions with negative charge. To increase the resistance of the TMO layer 54, a positive voltage from the voltage source 58 in an example is applied to the electrode 56 while the electrode 50 is set to the ground voltage. In this bias direction or current direction, the oxygen ions 53 in the buffer layer 52 are driven into the TMO layer 54 to fill the oxygen vacancies 55 in the TMO layer 54. As a result, the quantity of the oxygen vacancies 55 in the TMO layer is reduced, resulting in increasing the resistance. The resistance level may reach to the maximum state.

Figure 1B:
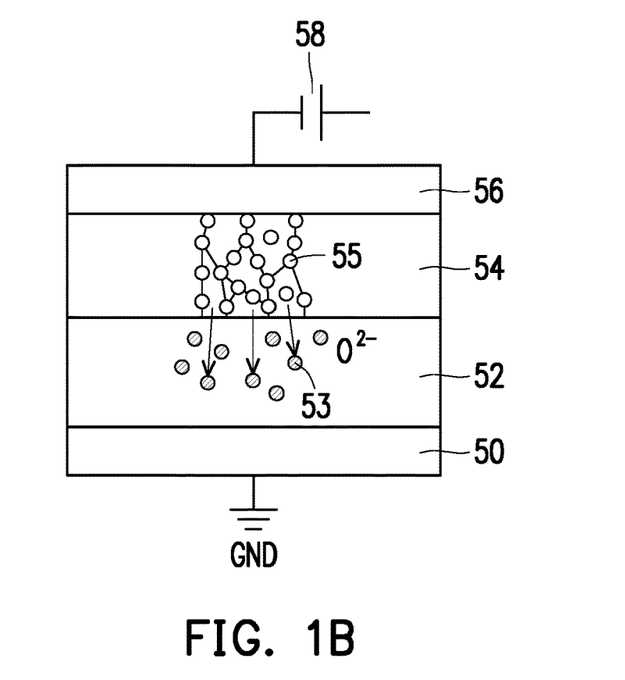
FIG. 1B is a drawing, schematically illustrating a mechanism of a set process on a ReRAM cell to have a low resistance state, according to an embodiment of the invention.

FIG. 1B is a drawing, schematically illustrating a mechanism of a set process on a ReRAM cell to have a low resistance state, according to an embodiment of the invention. Referring to FIG. 1B, to decrease the resistance of the TMO layer 54, a negative voltage from the voltage source 58 in an example is applied to the electrode 56 while the electrode 50 is set to the ground voltage. In this bias direction or current direction, the oxygen ions 53 in the TMO layer 54 are removed and driven back to the buffer layer 52. The oxygen ions 53 in TMO layer 54 are removed from the bonds causing more oxygen vacancies 55. As a result, the quantity of the oxygen vacancies 55 in the TMO layer is increased, resulting in decreasing the resistance. The resistance level may reach to the minimum state.

Figure 2:
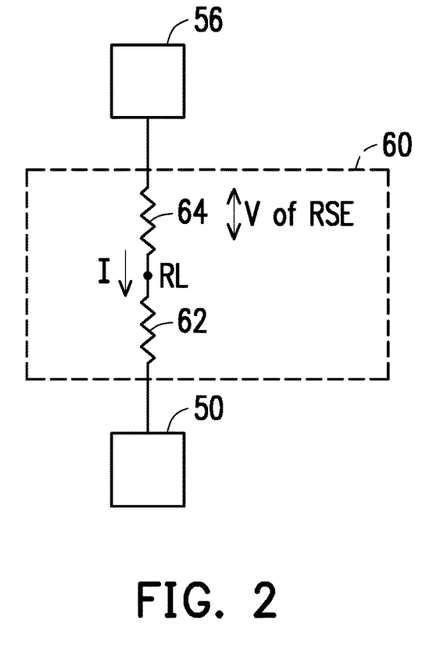
FIG. 2 is a drawing, schematically illustrating an equivalent circuit of ReRAM cell, according to an embodiment of the invention.

FIG. 2 is a drawing, schematically illustrating an equivalent circuit of ReRAM cell, according to an embodiment of the invention. Referring to FIG. 2, an equivalent circuit of a ReRAM cell includes a resistor 62 and the memory layer 64, coupled in series. The memory layer 64 in an example includes the buffer layer 52 and the TMO layer 54 in FIG. 1A or FIG. 1B. However, the stack direction between the buffer layer 52 and the TMO layer 54 may be in two directions opposite to each other. The electrode layer 50 and the electrode layer 56 may be a ground voltage or an operation voltage depending on the current direction to drive the oxygen ions. In other words, the electrode 50 is switched between the ground voltage and the applied voltage and the electrode 56 is also switched between the ground voltage and the applied voltage, so as to causing two current directions or bias directions to drive the oxygen ions 52. The resistor 62 has the constant resistance RL. The memory layer 64 has the resistance RES, which is variable depending on the current I. The current I flows through the memory layer 64 causing different resistance. The resistance level can be observed by the bias V of the memory layer (RES) 64, which is from the memory layer 64.

To easily describe the invention in an example, the memory cell 60 with the equivalent circuit is taken as an example. However, the resistor 62 with resistance RL may be connected to the electrode 56 in another example. The measuring mechanism is the same for this stack sequence. The measuring mechanism is following. The resistor 62 and the memory layer 64 are coupled in series to have a top electrode, a middle electrode and a bottom electrode. The resistor 62 and the memory layer 64 are coupled at the middle electrode, the electrode 56 is the top electrode and the electrode 50 is the bottom electrode. The voltages at these three electrodes are measured. The voltage V on the memory layer (Res) 64 is a voltage difference as measured. The current I may be calculated according to the resistor 62 by I=$V_{RL}$/RL, $V_{RL}$ is the voltage bias on the resistor 62. As a result, the I-V curve may be measured when the applied voltage is applied in a testing range.

Figure 3:
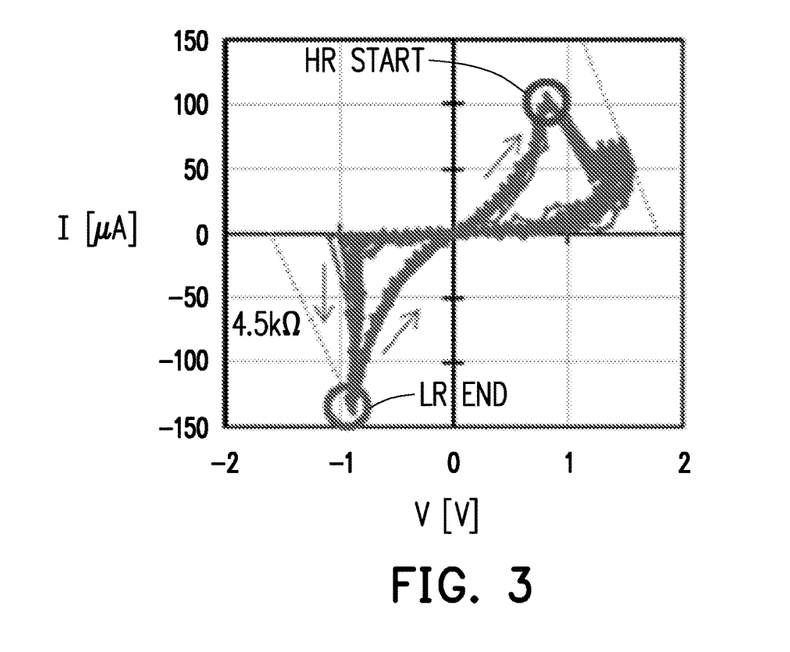
FIG. 3 is a drawing, schematically illustrating the I-V curve of the ReRAM cell in the reset path and the set path, according to an embodiment of the invention.

FIG. 3 is a drawing, schematically illustrating the I-V curve of the ReRAM cell in the reset path and the set path, according to an embodiment of the invention. Referring to FIG. 3, the resistance of the memory layer 64 may be observed according to Eq. (1) in a full voltage range from a negative voltage to a positive voltage.

Ideally, the reset path in the reset process as shown by the arrow direction is to change the resistance from low resistance at LR END to the high resistance at HR START. When the current I of the memory layer 64 reaches to the HR START, the current I turns back to the LR END, along the set path, in which the resistance RL of the resistor 52 is 4.5k ohms as an example. The reset path in the reset process is to decrease the resistance of the memory layer 64 from the HR START to the LR END.

As noted, the reset path is not continuously increasing but returns back to the the LR END. In this property, after the completion of test for all memory cells with the HR START to the LR END, the actual operation voltage for the memory cells may be set between the HR START to the LR END, otherwise the life-time of the memory cell may be reduced.

Figure 4A:
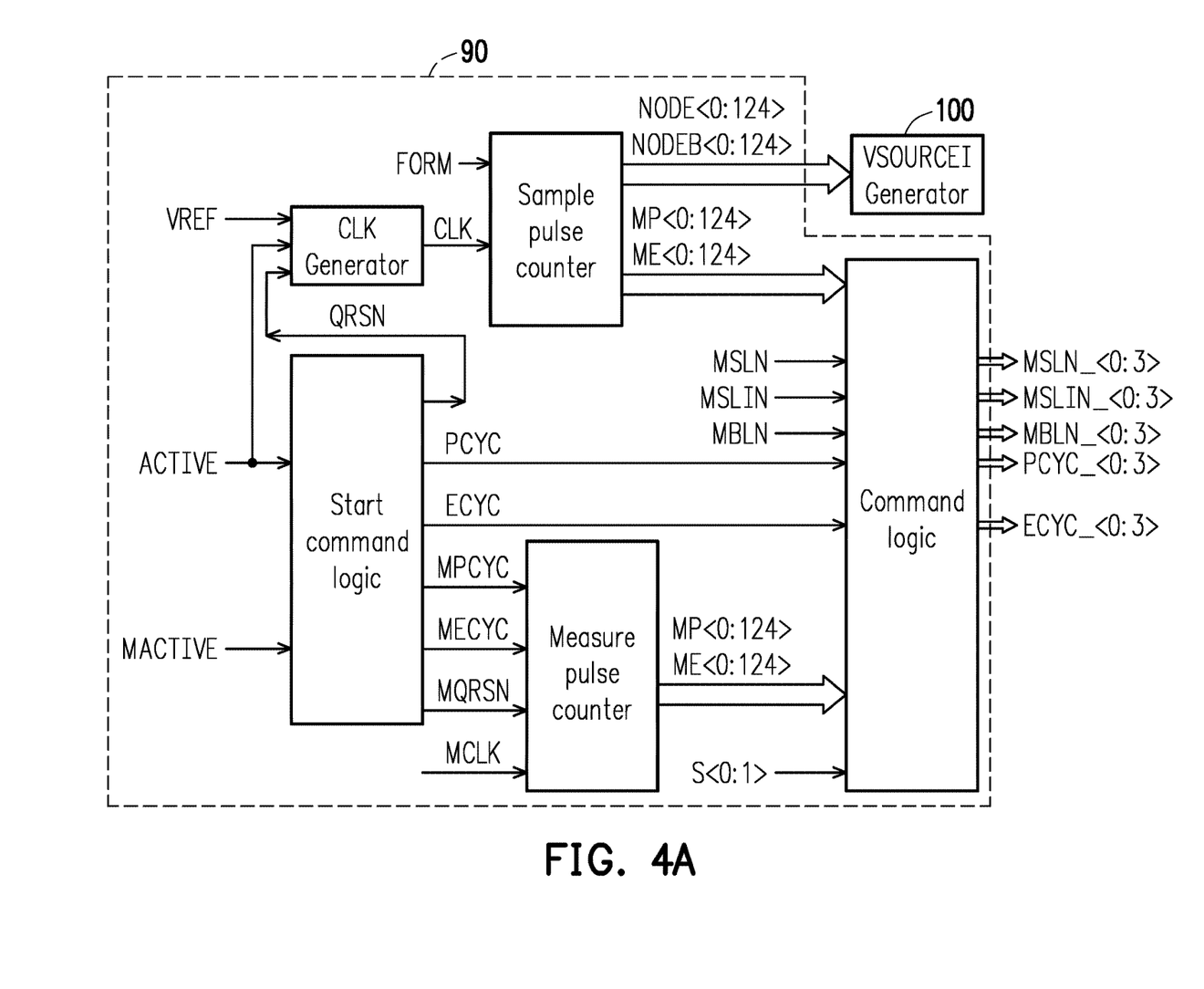
FIG. 4A is a drawing, schematically illustrating a control circuit part to provide bias on the ReRAM cell in testing stage, according to an embodiment of the invention.
Figure 4B:
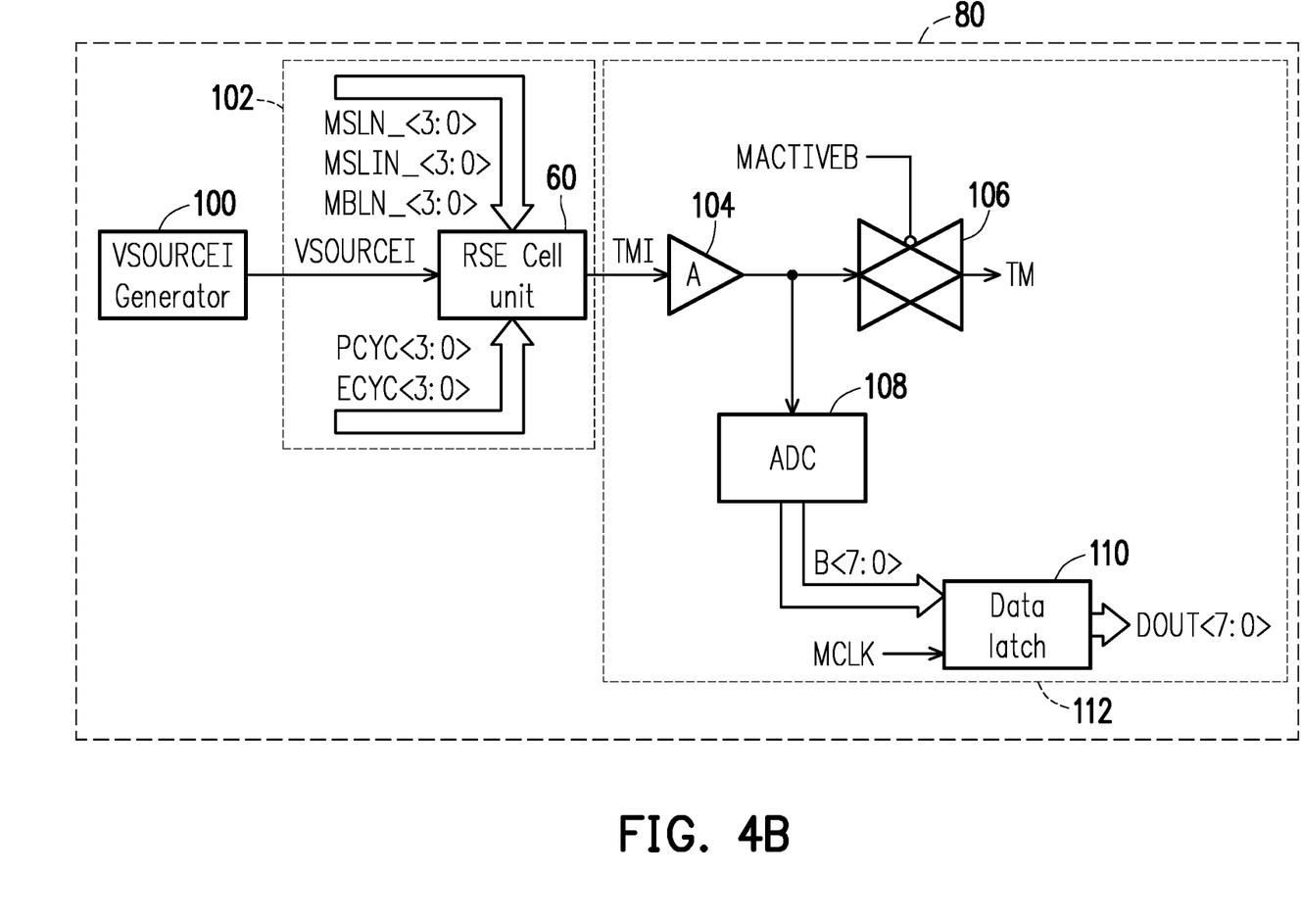
FIG. 4B is a drawing, schematically illustrating a cell trace circuit to test the ReRAM cell for obtaining the I-V curve in the rest path and the set path, according to an embodiment of the invention.

FIG. 4A is a drawing, schematically illustrating a control circuit part to provide bias on the ReRAM cell in testing stage, according to an embodiment of the invention. FIG. 4B is a drawing, schematically illustrating a cell trace circuit to test the ReRAM cell for obtaining the I-V curve in the rest path and the set path, according to an embodiment of the invention.

Referring to FIG. 4A and FIG. 4B together as one circuit, to efficiently measure the I-V curve for each tested cell, a voltage source generator 110, as also indicated by VSOURCEI generator 110, is controlled by the control circuit 90, so as to instruct the VSOURCEI generator 110 to apply voltage VSOURCEI to the tested memory cell. In addition, the control circuit 90 may use the signals MSLN, MSLIN, MBLN, PCYC and ECYC to select one tested cell from a cell group and control the switches in the cell trace circuit unit 80 in FIG. 4B, to set up the circuit route and the current direction for measuring the voltage at three electrodes as described in FIG. 2 or later in in FIG. 5. In an example, four cells "<0:3>" are treated as one cell group, so the signals would select one of the four cells for test in each time. The cell group may go through the whole cell array in general use. The control circuit 90 may include a start command logic, a clock (CLK) generator, a sample pulse counter, a measurement pulse counter and a command logic. The sample pulse counter provides signals, in an example, NODE <0:124> and NODEB <0:124> to instruct the VSOURCEI generator 100 to provide the voltage source VSOURCEI to the memory cell. The sample pulse counter may also provide signals MP and ME to the command logic, which is also receives the switch control signal PCYC and ECYC from the start command logic. The measure pulse counter may also receive the signals MPCYC, MECYC, MQRSN and MCLK, so as to provide the signals MP <0:124> and ME <0:124> to the command logic. The signal S <0:1> may activate the command logic. The CLK generator receives a reference signal VREF, an ACTIVE signal, and a start signal QRSN from the start command logic. The start command logic also receives the signal MACTIVE to activate the tart command logic. The control of the control circuit 90 is to select the memory cell from the RES cell unit 60 for test and apply the test voltages on the memory cell as selected. The actual circuit in the control circuit 90 is not just limited to the embodiment.

In FIG. 4B, the control circuit 90 is just an example to provides signal to the VOSOURCEI generator 100 to provide the voltage pulse onto the memory cell as selected for test in the cell circuit 102. The cell trace circuit unit 80 receives the signals from the control circuit 90 to measure the three voltages at the tope electrode, middle electrode and the bottom electrode as stated in FIG. 2 and FIG. 5. Since the current direction in the set path and the reset path is opposite, the switches are controlled to get the voltage applied to the memory cell. The memory cell is corresponding to the RES cell unit 60, which includes a cell group for selecting one cell. The measuring circuit 112 sense the voltage at the top/middle/bottom electrodes then amplifies the voltage signal by the amplifier (A) 104. The signal after the amplifier 104 is converted into digital form by the analog-to-digital converter (ADC) 108 and sequentially output through the data latch 110 as the output data, DOUT <7:0>, in which the data latch 110 is based on the clock signal MCLK. The output voltage at after the amplifier may be output as the signal TM by a switch 106 as controlled by the signal MACTIVEB.

As noted, the measuring circuit 112 in the embodiment is to measure the voltages and digitize the voltage. The circuit is not necessary to be limited to the circuit in the embodiment.

Figure 5:
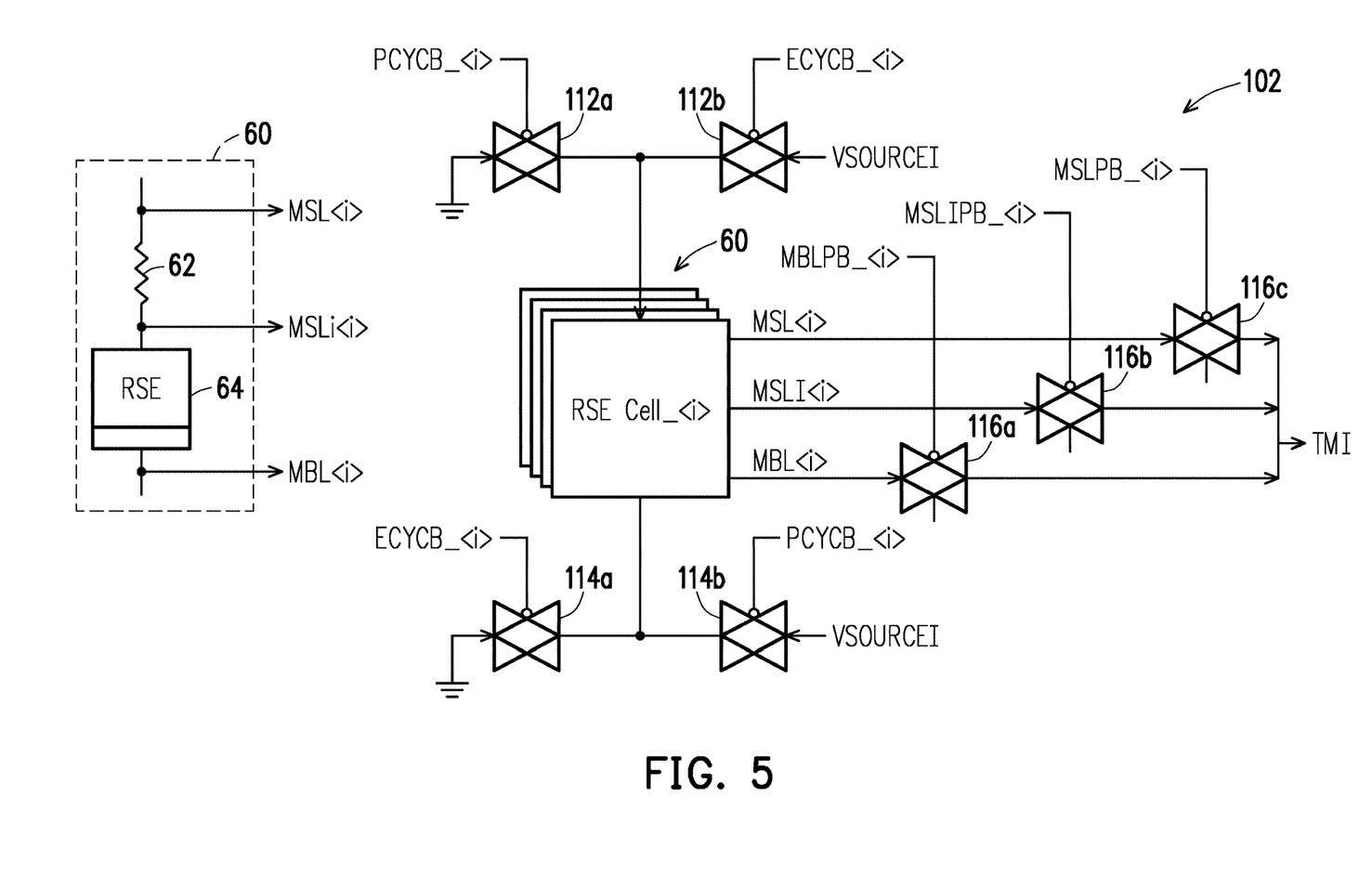
FIG. 5 is a drawing, schematically illustrating the cell trace circuit, according to an embodiment of the invention.

The cell circuit 102 in FIG. 4B is described in detail. FIG. 5 is a drawing, schematically illustrating the cell trace circuit unit, according to an embodiment of the invention. Referring to FIG. 5, the mechanism to apply the voltage to the memory cell in the RES cell unit 60 and output the voltages at the top/middle/bottom electrodes are described. Each memory cell as selected from the RES cell unit 60 in an example has the top electrode with the voltage MSL<i>, the middle electrode with the voltage MSLI<i>, and the bottom electrode with the voltage MBL <i>, in which "<i>" indicates the selected memory cell i from the RES cell unit 60. In order to control the current direction on the memory cell as selected from the RES cell unit 60, the top electrode is connected to the switch 112a and the switch 112b, which are respectively controlled by the signal PCYCB<i> and ECYCB<i> as provided from the command logic of the control circuit 90 in FIG. 4A. Likewise, the bottom electrode is connected to the switch 114a and the switch 114b which are respectively controlled by the signal ECYCB <i> and PCYCB <i>. The switch 112a and the switch 114a are connected to the ground voltage. The switch 112b and the switch 114b are connected to the voltage source VSOURCI, as to be input to the memory cell.

Figure 6:
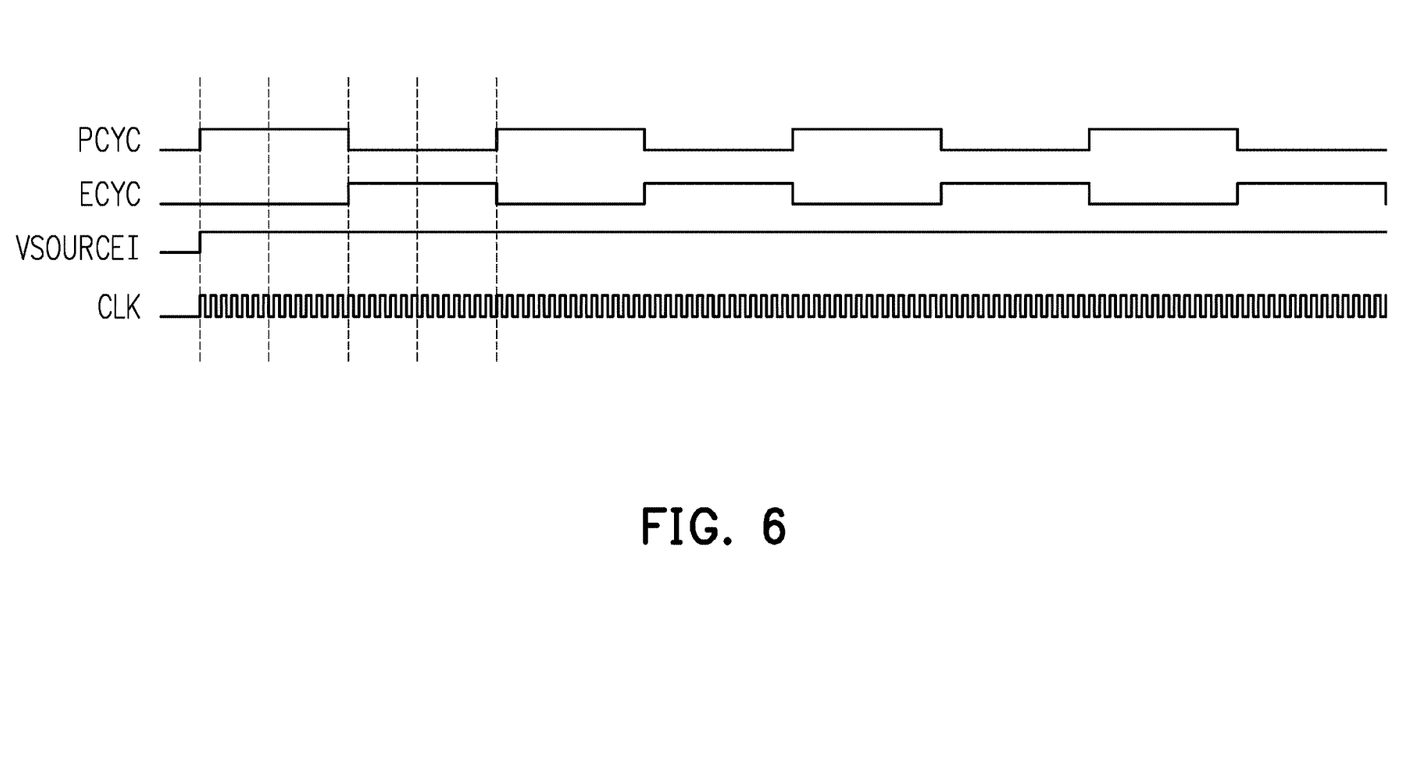
FIG. 6 is a drawing, schematically illustrating the voltage signal and the switch signal with respect to the clock signal at a forming stage, according to an embodiment of the invention.

The operation may also refer to FIG. 6. FIG. 6 is a drawing, schematically illustrating the voltage signal and the switch signal with respect to the clock signal at a forming stage, according to an embodiment of the invention.

Referring to FIG. 5 and FIG. 6, the signals ECYCB <i> and PCYCB are invert to each other. The voltage source VSOURCEI as input, in an example is positive voltage, used in forming the memory cell at the initial stage. However, the mechanism to control the current direction is the same in the invention. Here is to describe how to applied the voltage bias on the memory cell with respect to the current direction.

When the signal PCYC is high, then the signal ECYC is low. When the signal PCYC is low, then the signal ECYC is high. The signals ECYCB <i> and PCYCB are applied to the switches 112a, 112b, 114a, 114b. In the period as the signal PCYC is high and the ECYC is low, the switch 112a and the switch 114b are conducted. Then, the voltage source VSOURCEI is applied to the memory cell as selected in the RES cell unit 60 form the bottom electrode to the top electrode. This period may be corresponding to the negative current in the third quadrant of FIG. 3.

In the period as the signal PCYC is low and the ECYC is high, the switch 112b and the switch 114a are conducted. Then, the voltage source VSOURCEI is applied to the memory cell as selected in the RES cell unit 60 form the top electrode to the bottom electrode. The current direction with respect to the previous condition is switched. This period may be corresponding to the positive current in the first quadrant of FIG. 3. The first quadrant and the third quadrant are joined to form the I-V curve.

When the selected memory cell in the RES cell unit 60 is applied voltage, the voltages MSL<i>, MSLI<i> and MBL<i> at the top/middle/bottom electrodes are sequentially led out by the switch 116a, the switch 116b and the switch 116c, under control by the signal MBLPB_<i>, MSLIPB_<i>, and MSLPB_<i>. In an embodiment, the voltages MSL<i>, MSLI<i> and MBL<i> may be sequentially output in different measuring periods to a common node as the signal TMI for digitization. However, in another embodiment, the voltages MSL<i>, MSLI<i> and MBL<i> may be parallel output for digitization in the channels. The invention is not limited to the specific manner. The invention may measure the voltages MSL<i>, MSLI<i> and MBL<i> at the voltage source VSOURCEI, which may vary and repeat in multiple cycles. The signal TMI as shown in FIG. 4B is amplified and converted into digital data by the amplifier 104, the ADC 108 and the data latch 110 in circuit 112.

Figure 7:
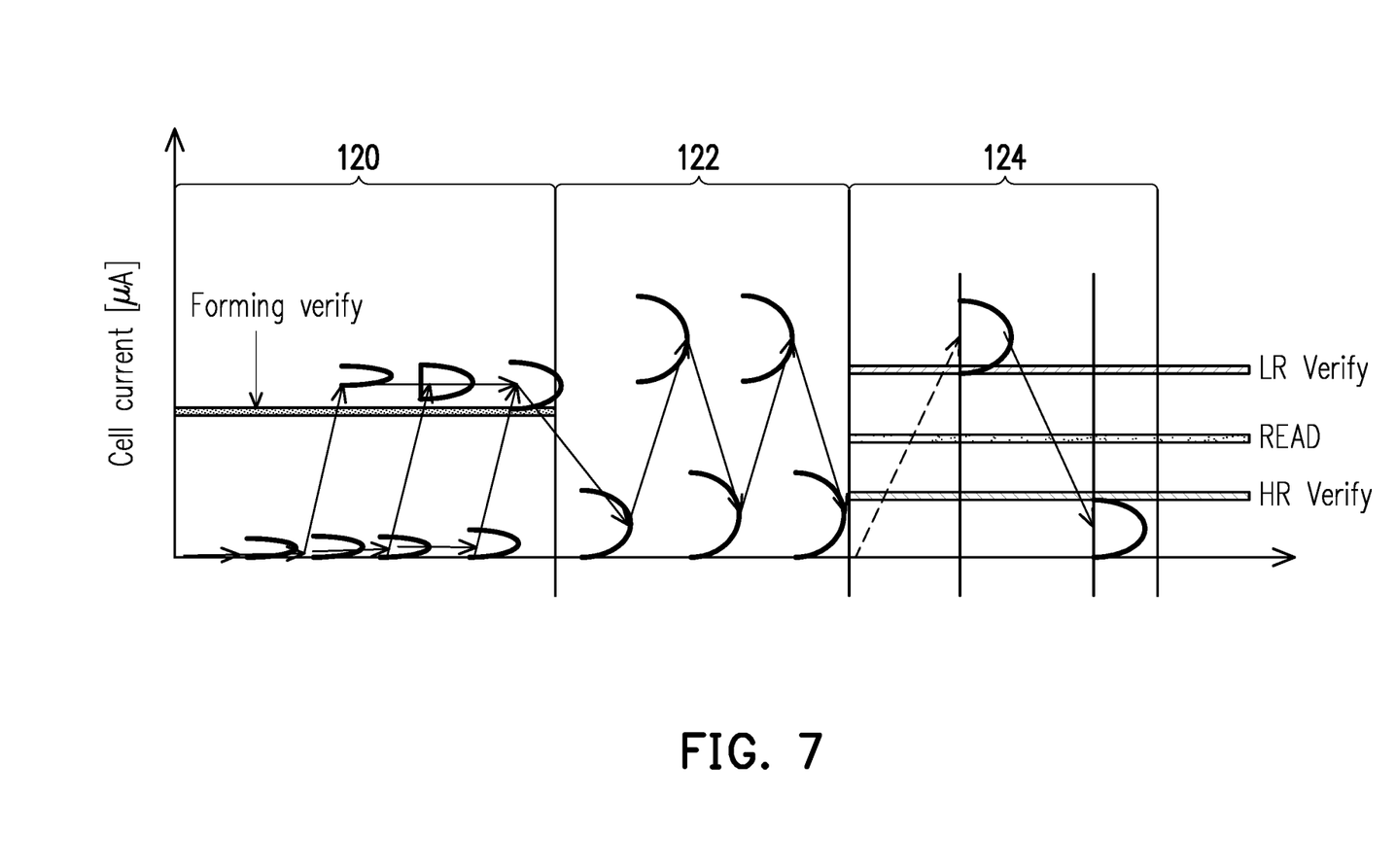
FIG. 7 is a drawing, schematically illustrating the forming stage, the pre-cycling stage and the operation stage for the ReRAM cell, according to an embodiment of the invention.

FIG. 7 is a drawing, schematically illustrating the forming stage, the pre-cycling stage and the operation stage for the ReRAM cell, according to an embodiment of the invention. Referring to FIG. 7, as to the ReRAM cell, just after fabrication by the semiconductor fabrication process, the two resistance states for the memory cell are still not created yet. Each memory cell needs a forming stage 120 to really activate the memory cell. During the forming stage 120, the voltage source VSOURCEI, as referring to FIG. 6, is fixed at 2.5 volts in an example to form the memory cell at the initial stage. In the forming stage 120, the voltages in two direction is repeated in two direction for several cycles as schematically indicated by the arrows. The current distribution for the all memory cells are also shown as the time goes in the forming stage 120. In the beginning, no current at all for the all cells. After certain cycles, a certain portion of the cells at the high resistance state are created, then a small amount of currents are observed at the high resistance state. After more cycles for activation, the low resistance state with the large current for some cells may be then created as observed from the distribution above the forming verify. At the end, all cell may be activated, then the current distributions the low resistance state and the high resistance state are successfully created for all the cells. In the forming stage 120, the VSOURCEI is constant and set to a slightly high voltage, such as 2.5V. After the forming stage 120, to assure the cell to work properly, the pre-cycle stage 122 may also performed. In the pre-cycle stage 122, the low resistance stage and the high resistance state, similar to the programing process, are performed to write into the low resistance stage and then the high resistance. After the pre-cycle stage 122, the memory cells are really activated and are ready for storing data in the operation stage 124. In the operation stage, a set process LR would change the resistance state of the memory cell to the low resistance state, resulting in high current above the LR verify level. A reset process HR would change the resistance state of the memory cell to the high resistance state, resulting in low current lower than the HR verify level.

Figure 8:
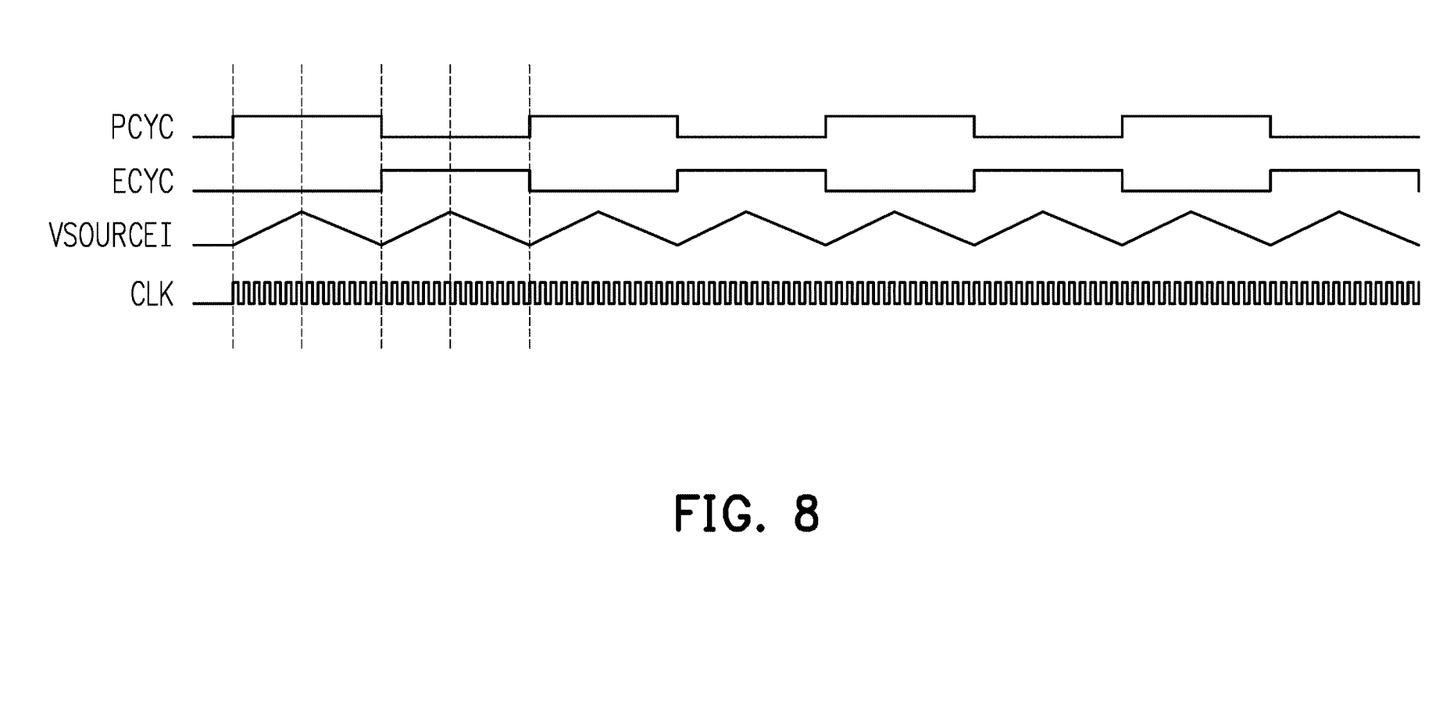
FIG. 8 is a drawing, schematically illustrating the voltage signal and the switch signal with respect to the clock signal in test stage, according to an embodiment of the invention.

FIG. 8 is a drawing, schematically illustrating the voltage signal and the switch signal with respect to the clock signal in test stage, according to an embodiment of the invention.

Referring to FIG. 8, during the test stage to measure the I-V curve, the voltage source VSOURCEI is changing from the ground voltage to a test voltage, such as 2.1V, less thane the forming voltage of 2.5V in FIG. 6. The VSOURCEI in an embodiment may be composed of a plurality of voltage pulses according to the clock signal CLK. In each PCYC cycle or ECYC cycle, the voltage source VSOURCEI is changing form the 0V to the 2.1V and then from 2.1 V to 0V, in an example, so as to fully observe the I-V curve.

As described in FIG. 5 and also referring to FIG. 2, in an example to the reset path or the set path, the first quadrant and the third quadrant are separately measured with the switches to control the current direction, so as to form the full I-V curves for the reset path and the set path.

According to the I-V curve for each cell, the resistance turning points at the LR END and the HR START are found. Then, a safe operation voltage is set between the LR END and the HR START. If the memory cell is failed, the full I-V curve cannot be successfully observed. In an example, the resistance turning point may be not found for the failed cell.

Figure 9:
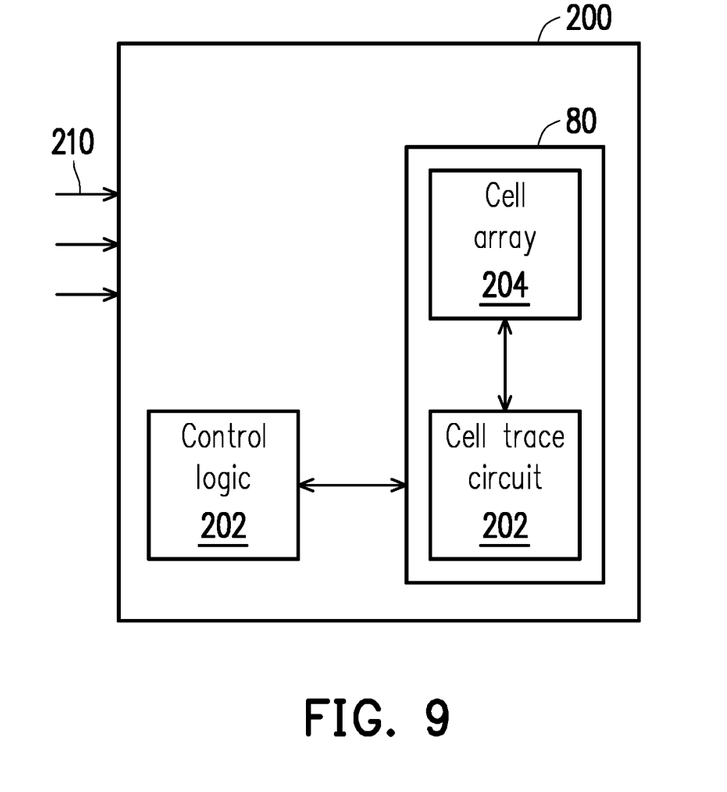
FIG. 9 is a drawing, schematically illustrating a ReRAM apparatus implemented with the cell trace circuit, according to an embodiment of the invention.

The invention uses the voltage pulses with varying voltage height to measure the I-V curve of the memory cell. The cell trace circuit unit may be implemented in the memory apparatus to test the all cells in the cell array. FIG. 9 is a drawing, schematically illustrating a ReRAM apparatus implemented with the cell trace circuit unit, according to an embodiment of the invention.

Referring to FIG. 9, a memory apparatus 200 may also implemented with the cell trace circuit unit 80 under control by the control logic 202. The cell trace circuit unit 80 includes the cell array 204 and the cell trace circuit 202 to access the cell in the cell array 204. The operation mechanism is based on the mechanism in FIG. 4A, FIG. 4B and FIG. 5. After all the cells in the cell array are test by measuring the I-V curves and determining the turning points of the LR END and the HR START. The distribution of the LR END and the HR START may be obtained to determine the actual operation voltages based on the statistic analysis. The safe operation voltages in the set path and the reset path is between the LR END and the HR START as result from the statistic analysis for the all cells.

Figure 10:
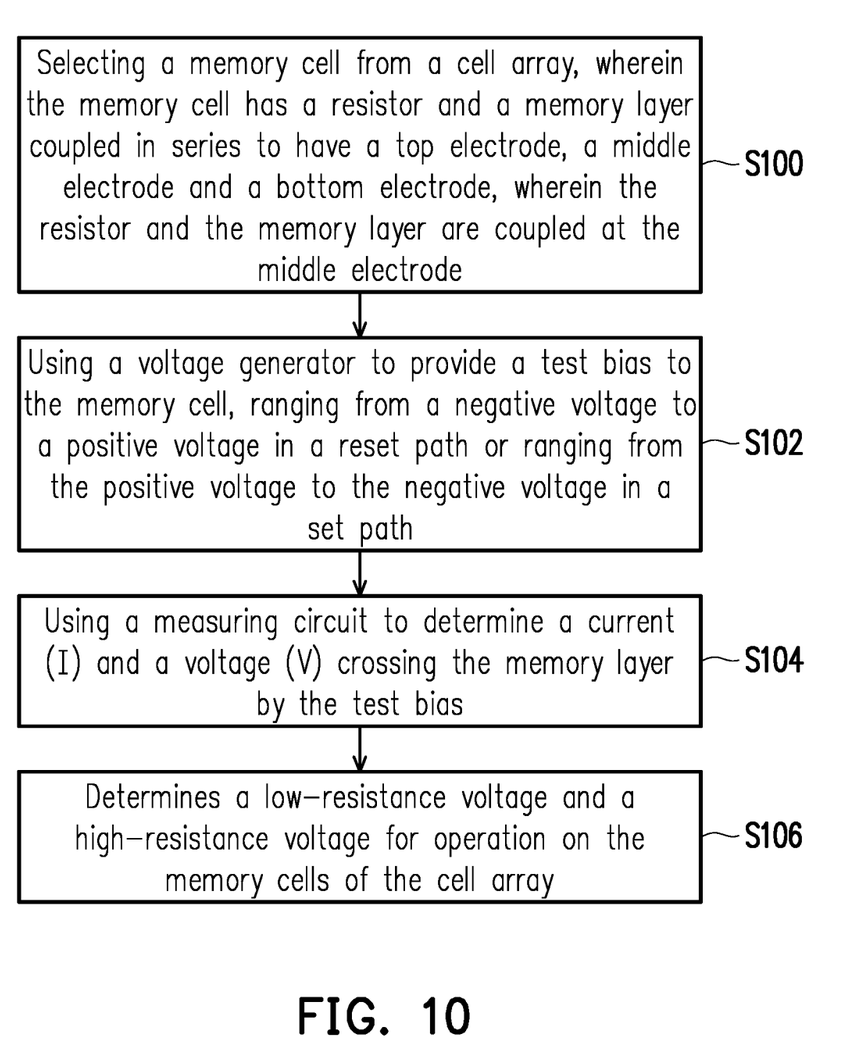
FIG. 10 is a drawing, schematically illustrating a method for measuring current-voltage (I-V) property of the ReRAM cells of the resistive memory apparatus, according to an embodiment of the invention.

FIG. 10 is a drawing, schematically illustrating a method for measuring current-voltage (I-V) property of the ReRAM cells of the resistive memory apparatus, according to an embodiment of the invention. As viewed in a method for measuring current-voltage (I-V) property of a resistive memory, the method may include steps S100-S106.

Referring to FIG. 10 and the foregoing descriptions for measuring the I-V curve, in step S10, it selects a memory cell from a cell array, wherein the memory cell has a resistor and a memory layer coupled in series to have a top electrode, a middle electrode and a bottom electrode, wherein the resistor and the memory layer are coupled at the middle electrode. In step S102, it uses a voltage generator to provide a test bias to the memory cell, ranging from a negative voltage to a positive voltage in a reset path or ranging from the positive voltage to the negative voltage in a set path. In S104, it uses a measuring circuit to determine a current (I) and a voltage (V) crossing the memory layer by the test bias. In step S106, it determines a low-resistance voltage and a high-resistance voltage for operation on the memory cells of the cell array.

The invention has proposed the cell trace circuit to measure the I-V curve for a memory cell in a efficient manner. The voltage source VSOURCEI as applied to the memory cell may be composed of voltage pulses, which is varying from the ground voltage to a test voltage, so as to form the I-V curve. The negative voltage corresponding to the third quadrant in I-V coordinate may be performed by the switch mechanism. The cell trace circuit may be used to write program the ReRAM cells when the cell trace circuit is implemented in the memory apparatus.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A cell trace circuit, comprising:
a memory cell, having a resistor and a memory layer coupled in series and having a top electrode, a middle electrode and a bottom electrode, wherein the resistor and the memory layer are coupled at the middle electrode;
a voltage generator, providing a test bias to the memory cell ranging from a negative voltage to a positive voltage in a reset or ranging from the positive voltage to the negative voltage in a set path; and
a measuring circuit to determine a current (I) and a voltage (V) crossing the memory layer by the test bias, wherein the voltage (V) is a voltage difference as measured, and the current (I) is calculated based on a voltage bias on the resistor.

2. The cell trace circuit of claim 1, wherein the test bias as provided by the voltage generator includes a plurality of voltage steps.

3. The cell trace circuit of claim 1, wherein the measuring circuit measures voltages at the top electrode, the middle electrode and the bottom electrode to determine the voltage (V) and the current (I).

4. The cell trace circuit of claim 1, comprising a control circuit, wherein the control circuit selects the memory cell from a cell array and provides the test bias by voltage steps in a first cycle and a second cycle.

5. The cell trace circuit of claim 4, wherein the control circuit in the first cycle sets the bottom electrode to 0V and applies the test bias to the top electrode to form a first part of an I-V curve at a first quadrant, wherein the control circuit in the second cycle sets the top electrode to 0V and applies the test bias to the bottom electrode to form a second part of the I-V curve at a second quadrant.

6. The cell trace circuit of claim 5, wherein the control circuit determines a low-resistance voltage and a high-resistance voltage for operation on the memory cell according to the I-V curve for the memory cell as tested.

7. The cell trace circuit of claim 1, wherein the cell trace circuit is implemented in a memory apparatus under control by a control logic to measure an I-V curve for each of a plurality memory cells of a cell array, and the control logic determines a low-resistance voltage and a high-resistance voltage for operation on the memory cells of the cell array, according to the I-V curves for all memory cells as tested.

8. The cell trace circuit of claim 1, wherein the voltage (V) is a divided voltage of the test bias on the memory layer and the current (I) is a calculated quantity according to a divided voltage on the resistor.

9. A method for measuring current-voltage (I-V) property of a resistive memory, comprising:
selecting a memory cell from a cell array, wherein the memory cell has a resistor and a memory layer coupled in series and has a top electrode, a middle electrode and a bottom electrode, wherein the resistor and the memory layer are coupled at the middle electrode;
using a voltage generator to provide a test bias to the memory cell, ranging from a negative voltage to a positive voltage in a reset path or ranging from the positive voltage to the negative voltage in a set path; and
using a measuring circuit to determine a current (I) and a voltage (V) crossing the memory layer by the test bias, wherein the voltage (V) is a voltage difference as measured, and the current (I) is calculated based on a voltage bias on the resistor.

10. The method of claim 9, wherein the test bias as provided by the voltage generator includes a plurality of voltage steps.

11. The method of claim 9, wherein the current (I) and the voltage (V) determined in the measuring circuit form an I-V curve for the reset path and the set path.

12. The method of claim 9, wherein the measuring circuit measures voltages at the top electrode, the middle electrode and the bottom electrode to determine the voltage (V) and the current (I).

13. The method of claim 9, wherein the measuring circuit as provided includes:
- an amplifier to amplify output voltages from the memory cell at the top electrode, the middle electrode and the bottom electrode;
- an analog to digital converter, receiving the output voltages; and
- a data latch, to output the voltage (V) in digital form.

14. The method of claim 9, comprising providing a control circuit, wherein the control circuit selects the memory cell from a cell array and provides the test bias by voltage steps in a first cycle and a second cycle.

15. The method of claim 14, wherein the test bias is applied between the top electrode and the bottom electrode but in different direction in the first cycle and the second cycle.

16. The method of claim 14, wherein the control circuit as provided also controls the memory cell with a forming bias to form a memory capability before providing the test bias.

17. The method of claim 14, wherein the control circuit in the first cycle sets the bottom electrode to 0V and applies the test bias to the top electrode to form a first part of an I-V curve at a first quadrant, wherein the control circuit in the second cycle sets the top electrode to 0V and applies the test bias to the bottom electrode to form a second part of the I-V curve at a second quadrant.

18. The method of claim 17, wherein the control circuit determines a low-resistance voltage and a high-resistance voltage for operation on the memory cell according to the I-V curve for the memory cell as tested.

19. The method of claim 9, wherein the method is adapted in a memory apparatus under control by a control logic to measure an I-V curve for each of a plurality memory cells of a cell array, and the control logic determines a low-resistance voltage and a high-resistance voltage for operation on the memory cells of the cell array, according to the I-V curves for all memory cells as tested.

20. The method of claim 9, wherein the voltage (V) is a divided voltage of the test bias on the memory layer and the current (I) is a calculated quantity according to a divided voltage on the resistor.

* * * * *